(12) United States Patent
Kawahara

(10) Patent No.: US 7,053,989 B2
(45) Date of Patent: May 30, 2006

(54) EXPOSURE APPARATUS AND EXPOSURE METHOD

(75) Inventor: Nobuto Kawahara, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 102 days.

(21) Appl. No.: 10/790,929

(22) Filed: Mar. 1, 2004

(65) Prior Publication Data
US 2004/0174514 A1  Sep. 9, 2004

(30) Foreign Application Priority Data
Mar. 4, 2003 (JP) .............................. 2003-057103

(51) Int. Cl.
G03B 27/58  (2006.01)
G03B 27/52  (2006.01)
G03B 27/42  (2006.01)

(52) U.S. Cl. .............................. 355/72; 355/30; 355/53
(58) Field of Classification Search .................. 355/30, 355/53, 72–76; 310/10, 12; 378/34, 35
See application file for complete search history.

(56) References Cited

U.S. PATENT DOCUMENTS

| 5,124,561 A | * | 6/1992 | Faure et al. ............. 250/505.1 |
|---|---|---|---|
| 6,163,365 A | | 12/2000 | Takahashi |
| 6,259,509 B1 | | 7/2001 | Miwa |
| 6,268,904 B1 | * | 7/2001 | Mori et al. .................... 355/53 |
| 2002/0154284 A1 | | 10/2002 | Sato |
| 2003/0035088 A1 | * | 2/2003 | Emoto ......................... 355/53 |
| 2005/0041226 A1 | * | 2/2005 | Tanaka et al. ................. 355/53 |

FOREIGN PATENT DOCUMENTS

| JP | 10-092727 | 4/1998 |
|---|---|---|
| JP | 2000-091207 | 3/2000 |
| JP | 2001-035777 | 2/2001 |
| JP | 2001-110710 | 4/2001 |

* cited by examiner

Primary Examiner—Henry Hung Nguyen
(74) Attorney, Agent, or Firm—Canon USA, Inc IP Division

(57) ABSTRACT

An exposure apparatus comprises an irradiation optical system for irradiating a pattern formed on an original plate with light emitted from a light source, a projection optical system for projecting a light image from the pattern onto a substrate, a drivable substrate stage for mounting the substrate, and a light absorber disposed on the substrate stage, wherein the light absorber is disposed on the substrate stage by a thermal insulating layer and/or a cooling unit. Thus, an exposure apparatus can be provided which performs exposure of a wafer without being influenced by adverse effects such as thermal deformation of units such as a wafer stage or the like due to exposure process other than exposure of the wafer, such as pre-exposure.

9 Claims, 12 Drawing Sheets

WAFER PROCESS

EXPOSURE APPARATUS AND EXPOSURE METHOD

BACKGROUND OF THE INVENTION

1. Field of the Invention

In general, the present invention relates to an exposure apparatus for manufacturing semiconductor devices, liquid crystal substrates, or imaging devices using lithography. In particular, the present invention relates to an exposure apparatus suitable for transferring a pattern formed on an original plate onto a photosensitive substrate through a projection optical system by performing suitable irradiation of the original pattern using a laser for generating pulsed light in the ultraviolet range, or to a device for emitting light in the extreme ultraviolet range as a light source.

2. Description of the Related Art

Within the semiconductor device manufacturing process, photolithography is performed, wherein irradiation light is cast onto an original plate having a desired circuit pattern formed on the surface thereof, which is referred to as "photomask" or "reticle" (hereinafter referred to as "mask"). This results in transferring of the pattern formed on the mask onto a photosensitive substrate (hereinafter referred to as "wafer") formed of a silicon or glass substrate of which the surface has been coated with a photosensitive material. An exposure technique for transferring the pattern with an equal magnification or a reduced magnification is used.

Using $\lambda$ as the wavelength of the exposure light employed for projection exposure, and NA as the numerical aperture of the projection optical system, in general, the resolution R is represented by the following expression, where k1 represents a coefficient:

$$R = k1 \cdot \lambda / NA \qquad \text{(Expression 1)}$$

Accordingly, improvement of the resolution R has been undertaken by increasing the numerical aperture NA and reduction of the wavelength of the irradiation light. As can be understood from the aforementioned expression, with the same numerical aperture, the resolution is improved as the wavelength of the irradiation light become shorter. That is, the resolution of the projection optical system is improved by replacing an extra-high pressure mercury lamp serving as a light source for projection for emitting an emission line such as the g line or the i line, with a KrF excimer laser with the wavelength of 248 nm. Furthermore, the light source for projection may be replaced by an ArF excimer laser with the wavelength of 193 nm, a F2 excimer laser with the wavelength of 157 nm, or an EUV light source with the wavelength of 4 to 20 nm, the resolution being further improved in that order.

On the other hand, with such an exposure apparatus employing an ArF excimer laser as a light source, for example, the range of the spectrum lines of the exposure light is included in the absorption spectrum range of oxygen, which leads to reduction of light efficiency due to oxygen absorbing the light. In addition, ozone occurs due to the absorption, further leading to reduction of the transmissivity of the optical system.

Even with an arrangement having a configuration wherein the wavelength bandwidth of the ArF laser beam is narrowed down so as to suppress absorption of light due to oxygen, the improved transmissivity is only approximately 98% for each optical path of 1 m.

Furthermore, the occurrence of ozone leads to chemical reaction of impurities such as moisture, hydrocarbons, or organic matter in the optical path, and the deposited impurities adhere to the surfaces of the optical devices, leading to reduction of the transmissivity of the optical system.

As an arrangement for solving the above-described problems such as reduction of the transmissivity of the optical system and the like, an exposure apparatus is disclosed in Japanese Patent Laid-Open No. 2000-091207, having a configuration wherein the inside of the optical system is filled with an inert gas such as nitrogen, helium, or the like, so as to eliminate impurities from forming reaction deposit on the optical path. Furthermore, the aforementioned exposure apparatus has an improved configuration wherein even in the event that impurity deposition occurs on the surfaces of the optical devices, the surfaces of the optical devices are cleaned with so-called photo-cleaning, thereby maintaining excellent transmissivity of the optical system.

The photo-cleaning employed in the aforementioned exposure apparatus works by employing the phenomenon wherein irradiation of the face to be cleaned, using light with a wavelength between 100 nm and 200 nm, causes for example, separation of the impurities deposited on or adhering to the surface of the face into suspended particles in the air. That is, with the photo-cleaning, exposure light such as an ArF laser beam is cast onto the surface of an optical device of which the transmissivity has deteriorated, so as to cause separation of the impurities adhering to the surface of the face into suspended particles in the air. Then the purge gas such as an inert gas with which the inside of the optical system including the optical device has been filled, is replaced by a new one so as to eliminate the impurities from the optical path.

In general, optical devices employed along with an excimer laser such as a KrF laser or an ArF laser serving as a light source, are formed of quartz or fluorite. In particular, with optical devices formed of quartz, it is known that in the event that on-time and off-time of irradiation are alternately performed, the transmissivity of the material changes corresponding to the on-time and the off-time of irradiation.

FIG. 7 shows the transmissivity of an optical system including optical devices formed of quartz in the event that intermittent irradiation of the optical system has been repeated using an ArF laser, wherein the transmissivity 84 immediately following irradiation which has been performed again exhibits a greater value than the transmissivity 83 immediately before off-time 82, and the optical system exhibits rapid reduction of the transmissivity following irradiation which has been performed again. While the projection exposure apparatus has a configuration for adjusting the output of the laser serving as a light source while monitoring reduction of the transmissivity so as to correct exposure so as to obtain stable irradiation, it is difficult to correct the rapid change of the transmissivity occurring immediately following irradiation as described above. Accordingly, with the aforementioned projection exposure apparatus, tens of thousands of non-exposing laser pulses are emitted prior to exposure following off-time for stabilizing the transmissivity of the optical system (hereinafter referred to as "pre-exposure"), which has been employed as an effective method for suppressing rapid change of the transmissivity (see for example U.S. Pat. No. 6,163,365).

As described above, the aforementioned exposure apparatus needs to perform the processes for irradiating the irradiation optical system and the projection optical system with irradiation light, such as the aforementioned photo-cleaning, pre-exposure, and the like, in order to maintain the optical performance thereof, in addition to exposure of wafers. However, the above-described conventional light-source device has disadvantages as follows.

First, the irradiation light for photo-cleaning or pre-exposure emitted from the light source passes through the same optical path as the exposure light for exposure process. Accordingly, the irradiation light is focused at a position on the surface of the wafer. In the event that the irradiation light is cast onto the wafer, the exposure portion of the wafer is exposed, and the exposure light must be cast onto a portion other than the wafer.

However, as depicted in FIG. 1, a wafer stage 32 includes stage mirrors 35 and 36 for performing measurement of the position of the wafer stage 32 using a laser interferometer (not shown), an illumination sensor 33 for measuring exposure irradiation on the surface of a wafer 30.

Accordingly, the exposure light may be scattered due to reflection or the surface shapes of these devices, leading to the wafer 30 being exposed.

Next, there is a problem of thermal deformation. For example, FIG. 6 is a schematic plan diagram which shows distribution of the temperature on the wafer stage 32 in the event that the exposure light is cast onto the illumination sensor 33 mounted on the wafer stage 32. In the drawing, upon exposure of the illumination sensor 33, the temperature of the sensor increases due to the energy of the exposure light. The surface temperature of the stage mirrors 35 and 36, and the wafer stage 32 surrounding the mirrors, increases as a result of the increase in the temperature of the illumination sensor 33. The increase in temperatures leads to the deterioration of the precise driving and positioning of the wafer stage 32. FIG. 6 shows a case where exposure light is cast onto the illumination sensor 33. In a case of exposure for photo-cleaning, or pre-exposure, exposure is made at a predetermined position on the wafer stage 32 in the same way thus, deterioration of the precise driving and positioning of the wafer stage 32 due to heating occurs under these exposure scenarios as well.

Several methods are known for blocking the exposure light emitted for photo-cleaning or pre-exposure employed in conventional projection exposure apparatuses. For example, FIG. 11 shows a projection exposure apparatus having a configuration disclosed in Japanese Patent Laid-Open No. 10-335235 (corresponding to U.S. Pat. No. 6,268,904), wherein the irradiation light cast onto a mask 21 is cast onto the wafer 30 through a projection optical system 25. A shutter 51 for blocking the irradiation light is mounted such that it can be inserted between the projection optical system 25 and the wafer 30.

With an arrangement having the above-described configuration, the shutter 51 blocks the irradiation light cast onto the wafer 30 or the wafer stage 32 during the above-described photo-cleaning or pre-exposure. Use of the shutter 51 to block the irradiation light prevents an increase of the temperature on the surface of the wafer stage 32 that would otherwise occur due to the irradiation light being cast onto the wafer stage 32. However, as discussed above, with the projection exposure apparatuses of recent years, in general, the resolution R is represented by the aforementioned Expression (1). As can be understood from the Expression (1), the resolution is proportional to the wavelength of the irradiation light, and inversely proportional to the numerical aperture NA of the projection optical system 25. Accordingly, the projection optical system 25 preferably employs the irradiation light with a small wavelength, and preferably has a large aperture number NA. However, with a large aperture number NA, the optical system 25 must have a configuration with a small distance between the final lens thereof for casting the irradiation light and the wafer 30. This results in a problem in that it is difficult to secure enough space for the shutter 51 to be inserted between the optical system 25 and the shutter 51. Even with an arrangement wherein a shutter 51 is inserted between the projection optical system 25 and the wafer 30, it can be clearly understood that the irradiation light will heat the shutter 51, and in turn, the wafer stage 32 will become heated due to the increase in the shutter's heat. Thus, the adverse effects due to heating will still occur.

In addition, with an arrangement having a mechanical configuration wherein the shutter 51 is driven above the wafer 30, there are problems associated with heating, dust, and the like, occurring from guide members or actuators for driving the shutter 51.

SUMMARY OF THE INVENTION

Accordingly, it is an object of the present invention to provide an exposure apparatus and an exposure method capable of operating without being influenced by adverse effects, such as thermal deformation of a unit such as a wafer stage or the like, due to exposure processing other than exposure of a wafer (e.g., photo-cleaning or pre-exposure).

It is another object of the present invention to provide an exposure apparatus and an exposure method capable of operating while preventing articles around the wafer stage from being influenced by heating due to exposure processing other than exposure of a wafer (e.g., photo-cleaning or pre-exposure).

In order to realize the above-described objects, according to one aspect of the present invention, an exposure apparatus an irradiation optical system for irradiating a pattern formed on an original plate with light emitted from a light source, a projection optical system for projecting a light image from the pattern onto a substrate, a drivable substrate stage for mounting the substrate, and a light absorber disposed on the substrate stage, wherein the light absorber is disposed on the substrate stage by a thermal insulating layer and/or a cooling unit.

Further objects, features and advantages of the present invention will become apparent from the following description of the preferred embodiments with reference to the attached drawings.

BRIEF DESCRIPTION OF THE DRAWINGS

The accompanying drawings, which are incorporated in and constitute a part of the specification, illustrate embodiments of the invention and, together with the description, serve to explain the principles of the invention.

DESCRIPTION OF THE PREFERRED EMBODIMENTS

Preferred embodiments of the present invention will be now be described in detail in accordance with the accompanying drawings.

First Embodiment

The following is a description of an exposure apparatus according to a first embodiment of the present invention.

Figure 10:
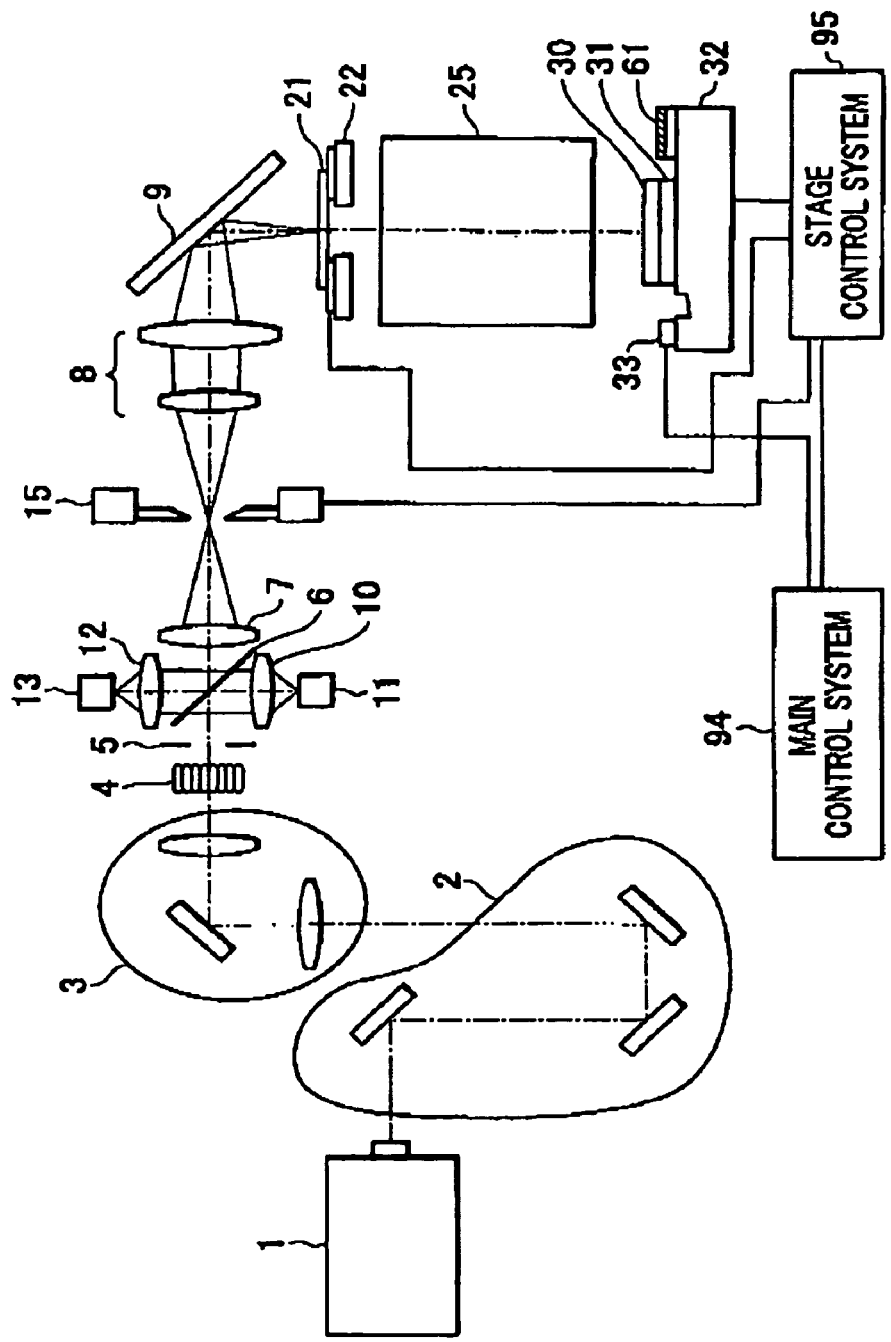
FIG. 10 is a diagram for describing the entire configuration of the exposure apparatus according to the present invention.
Figure 11:
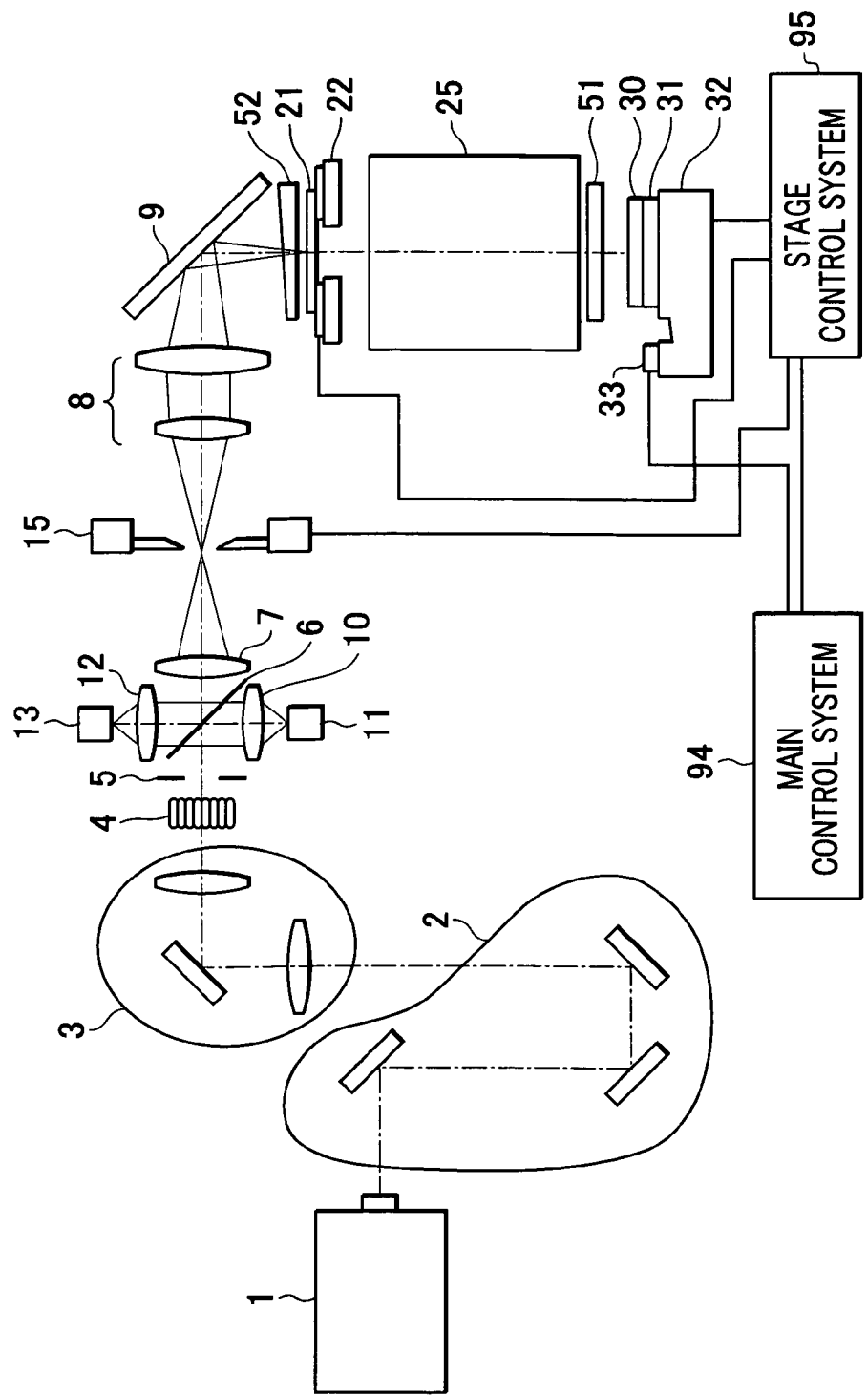
FIG. 11 is a diagram for describing a configuration example of a conventional exposure apparatus.

FIG. 10 is a schematic configuration diagram which shows an arrangement example of an exposure apparatus having a configuration according to the present invention. In the drawing, reference character 1 denotes an excimer laser, reference characters 2 and 3 denote an optical-path-adjustment optical system and an irradiation-shape-adjustment optical system respectively, for transmitting and shaping the light emitted from the laser 1. Reference character 21 denotes a mask having a predetermined pattern formed thereon serving as an original plate, while reference character 25 denotes a projection optical system for projecting the pattern image of the mask 21 onto a wafer 30. Reference character 32 denotes a wafer stage for driving and positioning the wafer 30. The present exposure apparatus is an example of an exposure apparatus (hereinafter referred to as "scanning exposure apparatus") for performing exposure of the wafer 30 so as to project a part of the pattern formed on the mask 21 onto the wafer 30 while irradiating the mask 21 on which the pattern has been formed. Exposure is synchronously performed for the mask 21 and the wafer 30, such that the pattern formed on the mask 21 is sequentially transferred onto the wafer 30. Note that in the present embodiment, while the description will refer to the aforementioned scanning exposure apparatus as an example, the present invention may be applied to any exposure apparatus that would allow practice of the present invention, e.g., an exposure apparatus that performs exposure all at once.

In recent years, with conventional exposure apparatuses, the size of the laser serving as a light source has increased due to improved functions such as an increase of output, reduction of the wavelength bandwidth, and the like. In addition, the size of the main unit of the exposure apparatus have increased as well due to improved functions such as improved capacity for performing exposure processing for large-sized wafers, and increase of the numerical aperture NA of the exposure optical system. As a result, typically, the main unit of the exposure apparatus and the laser 1 are formed as separate units. In some cases, the main unit of the exposure apparatus and the laser 1 are installed on different floors of a manufacturing facility. FIG. 10 depicts an arrangement example wherein the excimer laser serving as a light source is located on a floor lower than, and remote from, the main unit of the exposure apparatus, wherein the irradiation light emitted from the laser 1 is introduced into the main unit of the exposure apparatus through the optical-path-adjustment optical system 2. The optical-path-adjustment optical system 2 illustrated in FIG. 10 is comprised multiple mirrors. More specifically, the exposure light is emitted from the laser 1 with a cross-sectional shape of a general rectangle taken along a plane orthogonal to the optical path, with different scattering angles in the horizontal and vertical directions. The optical-path-adjustment optical system 2 performs shaping processing for the exposure light into the exposure light with a desired cross-sectional shape taken along a plane orthogonal to the optical path, and with desired scattering angles in the horizontal and vertical directions, using unshown multiple cylindrical lenses. Furthermore, the optical-path-adjustment optical system 2 has a function for correcting deviation of the optical axis by detecting the deviation of the optical axis due to relative vibration between the floor where the laser 1 is located and the floor where the main unit of the exposure apparatus is located, and deviation therebetween at the time of installation of the laser 1 and the main unit of the exposure apparatus, so as to adjust the positions and the attitude of the aforementioned mirrors and cylindrical lenses.

The irradiation light introduced into the main unit of the exposure apparatus through the optical-path-adjustment optical system 2 is subjected to further adjustment of the shape of the light flux by the irradiation-shape-adjustment optical system 3 so as to form a focused image onto the incident plane of an optical integrator 4. The irradiation-shape-adjustment optical system 3 includes a light flux adjustment means having conical prisms, roof prisms, or pyramid prisms (not shown), removably placed in the light path with a suitable combination of concaves and convexes. The light flux adjust means subjects the irradiation light to a shaping processing to shape it into the shape of a ring or into separate multiple light fluxes. Furthermore, the light-flux-adjustment means may have another configuration wherein cylindrical lenses or toric lenses are movably disposed with a suitable combination of concaves and convexes, such that the irradiation light flux is adjusted so as to have a cross-sectional shape with a desired horizontal/vertical ratio taken along a plane generally orthogonal to the optical axis of the irradiation light flux. While the light-flux-adjustment means has a configuration wherein the distance between the components included therein can be controlled so as to continuously adjust the shape of the output light flux, the entire light-flux-adjustment means serves as a telecentric optical system on the output side. The output irradiation light image is focused onto the input plane of the optical integrator 4 through a lens system.

The optical integrator 4 has a configuration wherein multiple microlenses are arrayed two-dimensionally, for example, so as to form a secondary light source near the output plane. The output irradiation light flux is subjected to more precise shaping processing with an aperture iris 5 to achieve a desired shape.

Detailed description regarding the aperture iris 5 and the surrounding optical system is provided below. The light flux from the secondary light source output from the optical integrator 4 is projected onto the wafer 30 so as to form an image of the pattern of the mask 21 through the projection optical system 25, whereby exposure of the wafer 30 is made. In this case, the resolution R is represented by the above-described Expression (1).

In general, exposure apparatuses with a numerical aperture NA of 0.7 through 0.8 are employed in practical use, and the coefficient k1 in the Expression (1) of approximately 0.35 can be realized using the phase shift method. However, an exposure apparatus with a large numerical aperture NA, which has the advantage of high resolution, exhibits a low focal depth on the wafer 30. This leads to the problem that substantial positioning precision is required with regard to the wafer 30 and the exposure apparatus. Accordingly, with the exposure apparatus according to the present invention, the ring-shaped irradiation or multi-source irradiation is employed, for example, so as to realize both high resolution and high focal depth.

With the ring-shaped irradiation, an iris having a ring-shaped aperture (i.e., effective light source) is inserted into a position of the aperture iris 5 so as to adjust the shape of the irradiation light cast onto the mask 21. In general, the ring-shaped aperture has a configuration with the numerical aperture NA1 on the side of the inner circle of 0.45 or greater, with the numerical aperture NA2 on the side of the outer circle of 0.85 or less, and with the ratio of NA1 to NA2 of 1/2 to 3/4, for example. Furthermore, an arrangement may be made wherein the shape of the light flux is adjusted with the aforementioned light-flux-adjustment means such that the shape of the irradiation light cast onto the aperture iris 5 generally matches the shape of the aperture of the aperture iris 5, thereby improving usage efficiency of the irradiation light. Note that the technique for shaping the irradiation light flux is described in U.S. Pat. No. 5,345,292, for example, and accordingly, a detailed description will be omitted regarding the layout of the optical devices forming the aforementioned optical system.

The irradiation light output from the aperture iris 5 is split into two light fluxes with a half mirror 6. The half mirror 6 is coated with a semi-transparent film having a transmissivity of 95% or more. Accordingly, while the most of the input irradiation light passes through the half mirror 6, a part is reflected so as to be collected onto a sensor 11 for detecting the amount of light, thereby enabling measurement of the output of the laser 1 serving as a light source. An arrangement may be made wherein a two-dimensional sensor is employed as the sensor 11 so as to detect the shape of the irradiation region subjected to shaping processing by the irradiation-shape-adjustment optical system 3. However, in this stage, the integrated amount of the irradiation light over the entire irradiation region should be detected, and accordingly, there is no need to employ a two-dimensional sensor as the sensor 11. Rather, an arrangement may be made wherein the sensor for detecting the amount of light is switched to another kind of sensor according to required functions. The detected output from the laser 1 serving as a light source is transmitted to a main control system 94. The main control system 94 adjusts the output or the oscillation pulses of the laser 1 based upon the detected output so as to control the intensity of the irradiation light, thereby enabling stable intensity thereof within a predetermined range.

The irradiation light image that has passes through the half mirror 6 is focused onto a movable blind 15 through a lens 7. The light flux, which has passed through an aperture formed by controlling the movable blind 15, passes through in the direction of an imaging optical system 8. The detailed configuration of the movable blind 15 is described in U.S. Pat. No. 6,259,509, and published U.S. application 2002154284, and therefore, the description will is omitted. Note that the movable blind 15 is disposed on the Fourier transformation plane of the output plane of the optical integrator 4 from the perspective of optics, and at a position conjugate as to the mask 21.

The imaging optical system 8 serves as an optical system for further forming an image, which has been formed by the movable blind 15 on the mask 21. With the above-described configuration, the irradiation light image, which has been focused on the movable blind 15, is focused with a predetermined magnification R2 on the mask 21 mounted on the mask stage 22. Furthermore, the irradiation light, which has passed through the mask 21, is cast onto the wafer 30 through the projection optical system 25, whereby the pattern formed of a Cr film or the like on the mask 21 is transferred onto the wafer 30 by image formation.

Both the exposure apparatus which makes exposure of a wafer all at once and the scanning exposure apparatus have generally the same configuration as described above. With the scanning exposure apparatus (i.e., scanner), the mask 21 and the wafer 30 are mounted on the mask stage 22 and the wafer stage 32 respectively, so as to be moved independently within the plane generally orthogonal to the light axis of the irradiation light. Thus, exposure of the wafer 30 is made by synchronously scanning the mask 21 and the wafer 30 under the irradiation light. Note that the present embodiment may be applied to an exposure apparatus which makes exposure of a wafer all at once (i.e., stepper).

Accordingly, the mask stage 22 is connected to an unshown structure member through a static-pressure guide member so as to be driven in the scanning direction using an unshown driving system such as a linear motor. The mask stage 22 is driven according to instructions from the stage control system 95 while monitoring the driving position detected by an unshown laser interferometer. Furthermore, the wafer stage 32 is supported by an unshown structure member through a static-pressure guide member so as to be two-dimensionally driven in the scanning direction and in the direction orthogonal to the scanning direction (hereinafter referred to as "slit direction") using an unshown driving system such as a linear motor. The wafer stage 32 is driven according to instructions from the stage control system 95 while monitoring the driving position detected by the laser interferometer. Exposure of the wafer 30 is made by synchronously driving these stages. Specifically, per instructions from the stage control system 95, the wafer 30 is scanned by the wafer stage 32 either in the scanning direction or the direction reverse to the scanning direction synchronously with scanning of the mask 21 by the mask stage 22 in the direction opposite to the scanning direction or in the scanning direction).

As described above, the exposure apparatus performs exposure process for the aforementioned photo-cleaning, pre-exposure, or the like, in addition to the exposure process for transferring a pattern onto the wafer 30. Also, as described above, in general, optical devices employed along with an excimer laser such as a KrF laser, an ArF laser, or the like, serving as a light source, is formed of quartz or fluorite. In particular, with an optical device formed of a quartz material, it is known that in the event that on-time and off-time of irradiation are alternately performed with the aforementioned excimer laser beam, the transmissivity of the optical device changes corresponding to the on-time and the off-time of irradiation.

Figure 7:
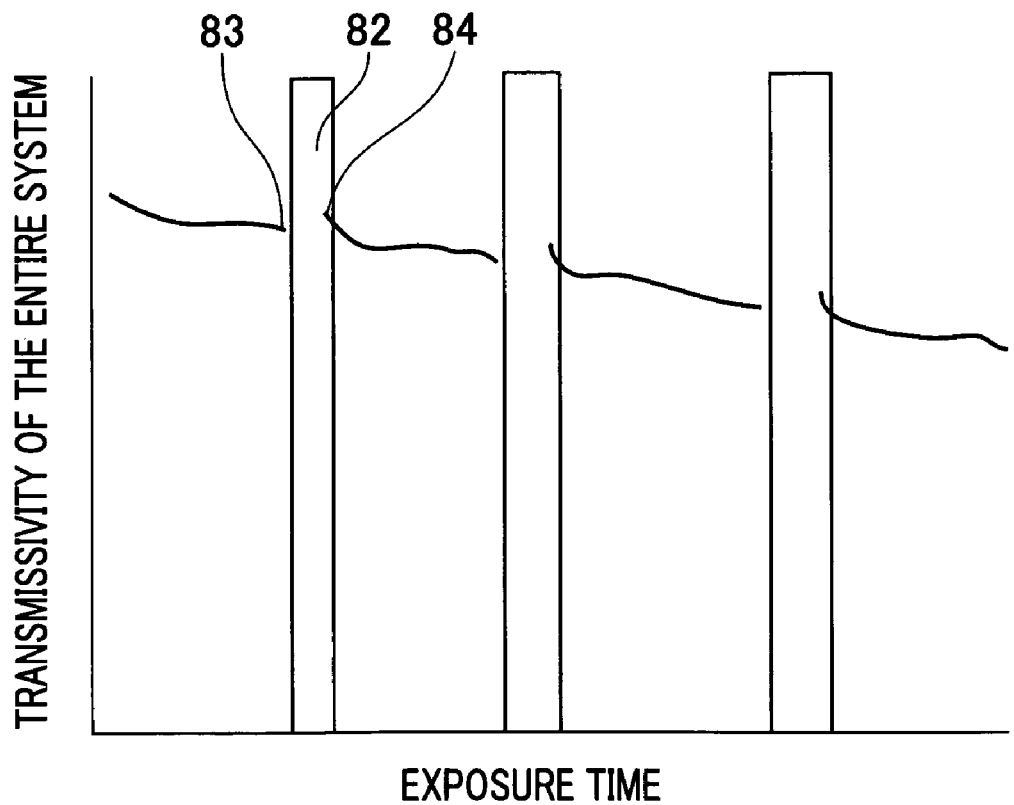
FIG. 7 is a chart for describing the change in the transmissivity of the entire optical system.
Figure 8:
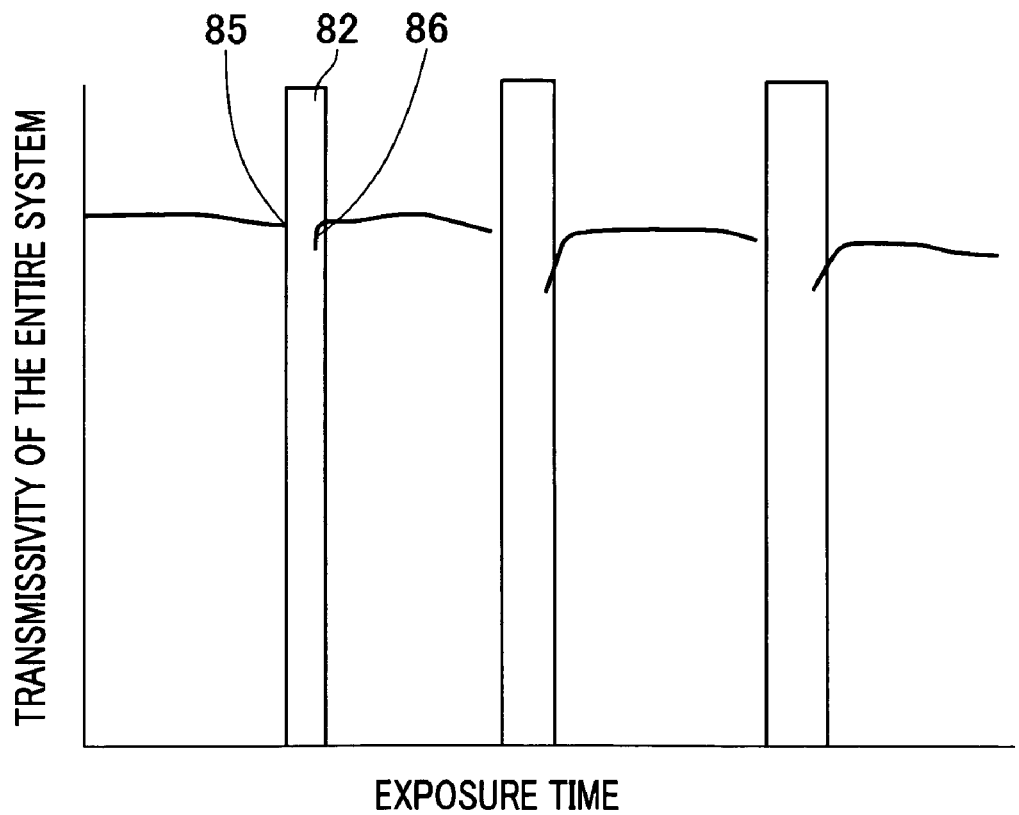
FIG. 8 is a chart for describing deterioration in the transmissivity due to adhesion of impurities to optical devices.
Figure 9:
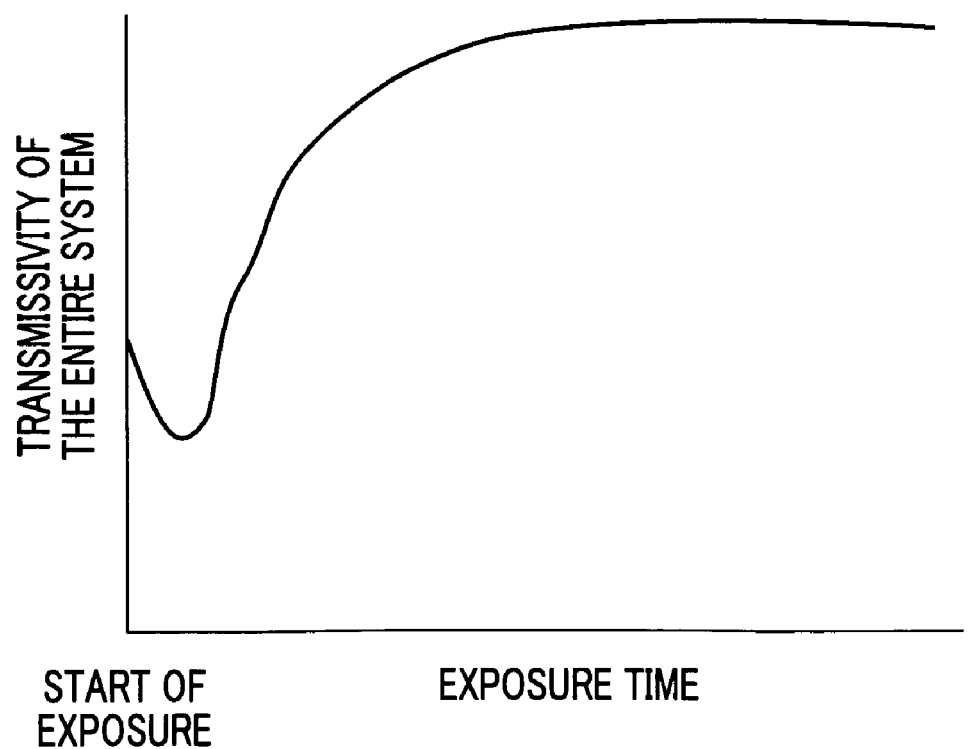
FIG. 9 is a chart for making description in detail regarding deterioration of the transmissivity.

FIG. 9 illustrates the change in the transmissivity of the entire system of the exposure apparatus over exposure time with a laser. Note that the transmissivity of the entire system is the ratio of the output intensity measured with the illumination sensor 33 disposed on the wafer stage 32 to the output intensity measured with an unshown illumination sensor disposed at the output of the laser 1. As can be understood from FIG. 9, immediately following the start of exposure with the laser beam, the transmissivity of the entire system temporarily decreases, followed by a gradual increase until saturation occurs. That is to say, immediately following exposure with a laser beam, rapid deterioration occurs in the transmissivity of the optical-device material, leading to deterioration in the transmissivity of the entire system. Subsequently, impurities, moisture, or the like, which have adhered to the surfaces of the optical devices within the optical system, are activated and separated from the surfaces of the optical devices (i.e., photo-cleaning is performed) due to exposure with the laser beam, thereby increasing the transmissivity of the entire system. Accordingly, in general, the transmissivity 84 immediately following the restart of exposure is smaller than the transmissivity 83 immediately prior to the off-time 82. Note that in general, in a case of adjusting the exposure parameters or in a case of exchange of the wafer lot, the exposure apparatus enters off-time 82 as shown in FIG. 7. On the other hand, with an arrangement further including functions wherein irradiation with non-exposing laser pulses, also referred to as "pre-exposure", is performed for the optical system for completion of exposure of each wafer lot including multiple wafers, and further including measuring the transmissivity of the optical system for each exposure step so as to correct the exposure amount, this arrangement has the advantage that the transmissivity 85 immediately prior to the off-time 82 is generally the same as the transmissivity 86 immediately following the restart of exposure, as shown in FIG. 8.

Figure 1:
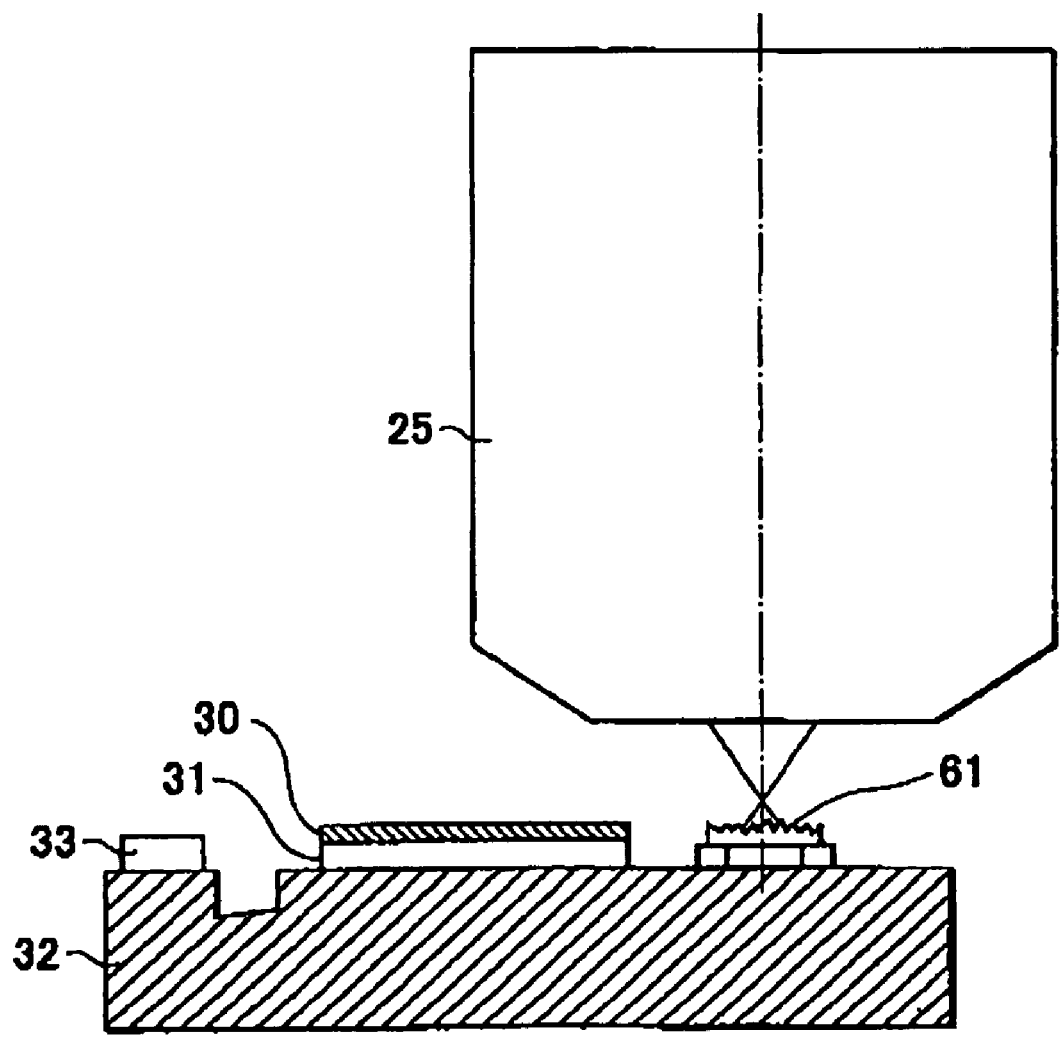
FIG. 1 is a diagram for describing the placement of a light absorber according to the present invention.

In general, in the process of photo-cleaning or pre-exposure (hereinafter referred to as "pre-exposure process"), the laser beam is preferably cast onto the surfaces of the optical devices forming the optical system in as wide a range thereof as possible. Accordingly, with the exposure apparatus according to the present embodiment shown in FIG. 10, the irradiation conditions are switched to those wherein the optical system from the optical-path-adjustment optical system 2 to the projection-optical system 25 has an effective diameter of the maximal NA, and both the aperture iris 5 and the movable blind 15 are opened at the maximum. The irradiation light emitted from the laser 1 is cast onto the maximal effective area of each optical device, passes through the projection optical system 25, and the irradiation light is cast onto the wafer stage 32. The exposure apparatus according to the present embodiment includes a light absorber 61 on the wafer stage 32 as depicted in FIG. 1. Upon the start of the pre-exposure process, the wafer stage 32 is driven such that the light absorber 61 is positioned on the exposure region of the projection optical system 2 according to instructions from the stage control system 95. In the pre-exposure process, while hundreds to thousands of laser pulses are emitted, most of the laser pulses are cast onto the light absorber 61. Immediately prior to the last several laser pulses in the pre-exposure process, the wafer stage 32 is driven again such that the illumination sensor 33 is positioned on the exposure region. In the exposure step for the aforementioned last several laser pulses, a comparison is made between the laser beam intensity detected by the sensor 11 disposed at the output of the laser 1 or on the optical path where the light split from the half mirror 6 passes through, and the laser beam intensity detected by the illumination sensor 33 on the wafer stage 32. To the comparison is performed in order to estimate the degree of deterioration in the transmissivity of the entire system of the exposure apparatus, or the degree of recovery thereof. The exposure apparatus modifies correction coefficients for calculating the exposure amount on the wafer face based upon the output from the sensor 11, as well as making a determination whether or not the pre-exposure has succeeded, based upon the aforementioned information.

Figure 3:
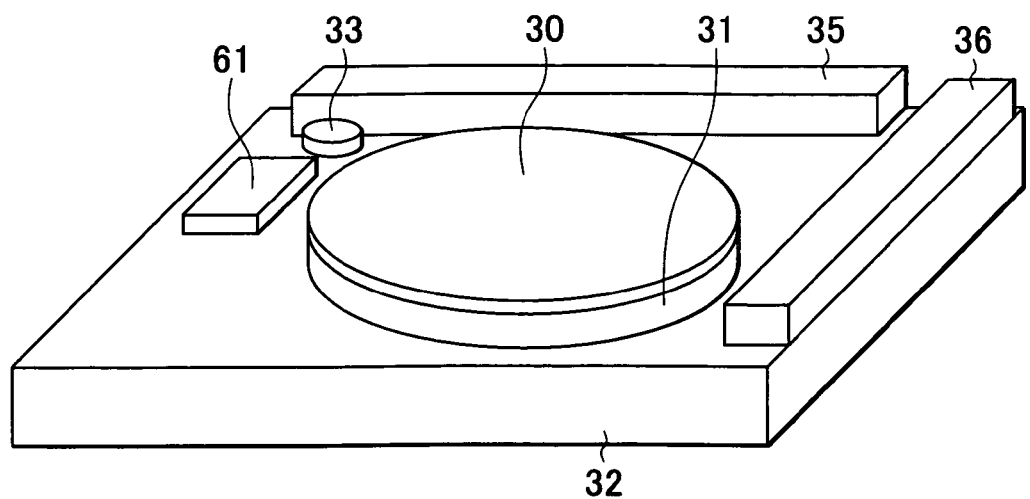
FIG. 3 is a diagram for describing the layout on the wafer stage.

As discussed above, in the pre-exposure process, switching is performed between the state wherein the light absorber 61 is positioned on the exposure region and the state wherein the illumination sensor 33 is positioned on the exposure region. Accordingly, an arrangement may be made wherein the light absorber 61 is disposed near the illumination sensor 33 on the wafer stage 32, as shown in FIG. 3. With such a configuration, the time for switching between the state wherein the light absorber 61 is positioned on the exposure region and the state wherein the illumination sensor 33 is positioned on the exposure region can be reduced. Note that reference numerals 35 and 36 denote stage mirrors.

Since the surface of the light absorber 61 is exposed to the irradiation energy due to laser irradiation in the pre-exposure process, a significant thermal load is applied to the light absorber 61, leading to a problem that thermal deformation of the light absorber 61 may occur. Accordingly, with the present embodiment, the light absorber 61 is formed of copper plate as a base material, and has a TiALN film on the surface thereof formed by ion plating. Note that the material forming the light absorber 61 is not restricted to a particular one, rather any material such as glass, ceramic, or crystal material, as well as metal, may be employed as long as change or deterioration in the properties thereof does not occur due to exposure with the exposure light.

Furthermore, the surface of the light absorber 61 is roughened with surface roughness Ra of around 200 μm by shot peening or chemical etching, thereby reducing the surface reflectivity to 0.5% or less for the exposure light. In the present embodiment, while description has been made regarding an arrangement wherein the roughness of the light absorber 61 and the method for the roughening processing are determined for an exposure apparatus wherein a KrF or ArF excimer laser is employed as an exposure light source, and the maximal numerical aperture NA of the projection optical system is 0.95, the reflection properties vary correspondingly to the kind of the exposure light source and the maximal numerical aperture (NA). Accordingly, the roughness and the method for roughing processing is not restricted to the above-described arrangement according to the present embodiment and any roughness roughing processing method that would allow practice of the current invention are applicable.

Figure 5:
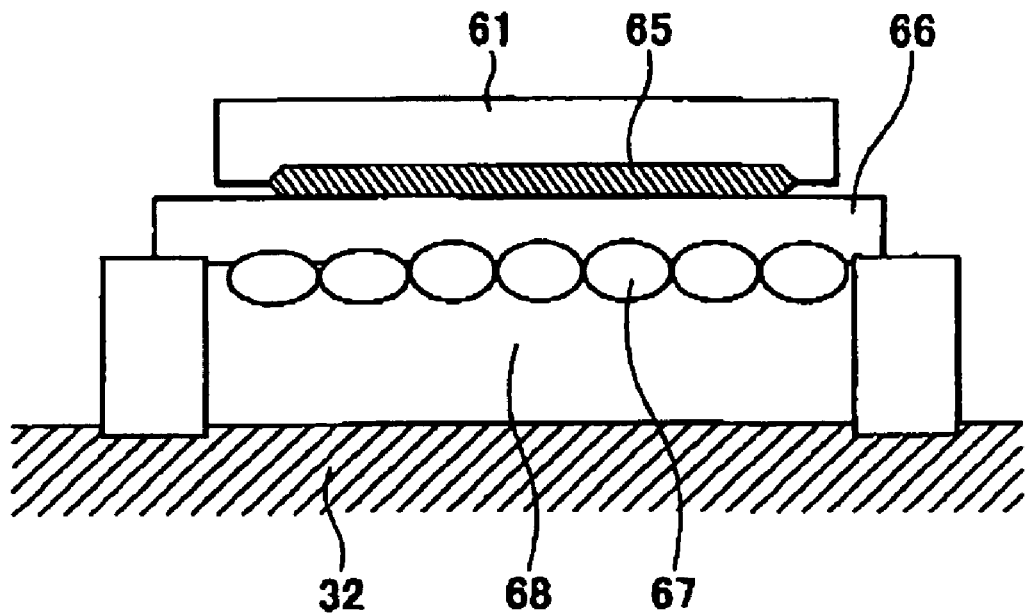
FIG. 5 is a diagram which shows a configuration example including the light absorber.
Figure 6:
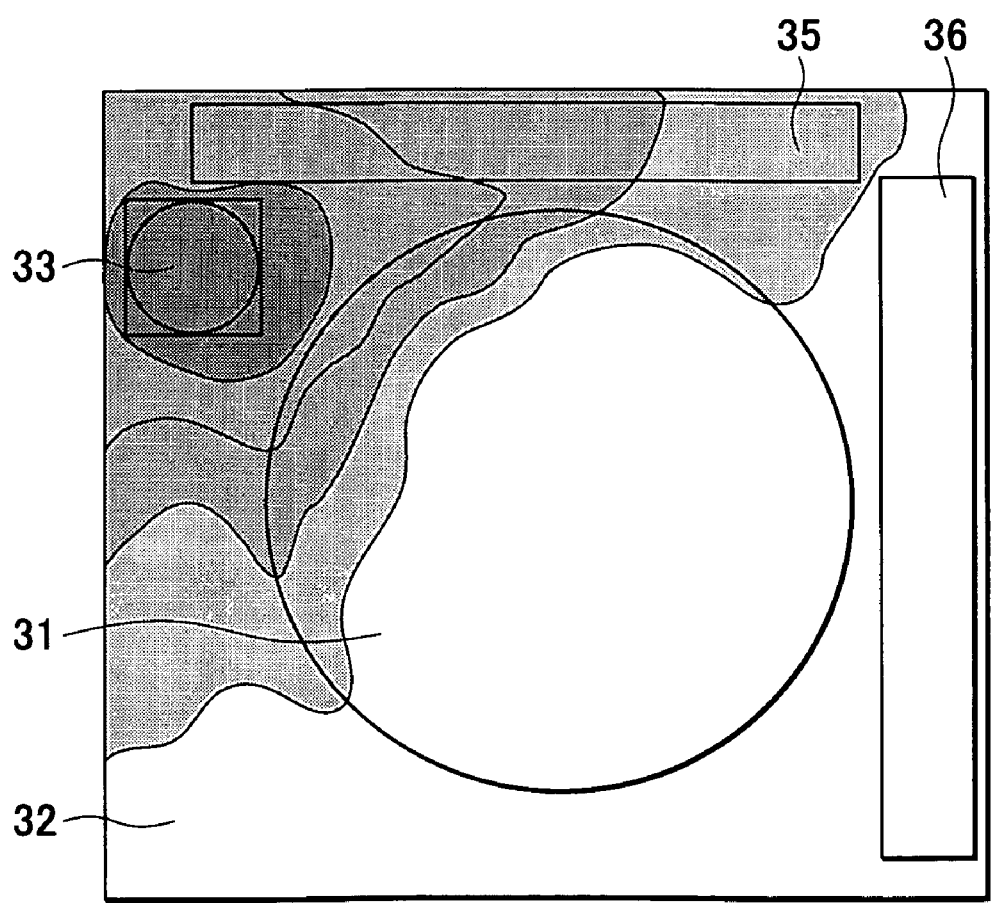
FIG. 6 is a diagram for describing an example of the temperature distribution on the wafer stage.

With the light absorber 61 having such a configuration, exposure light cast onto the light absorber 61 is absorbed by the light absorber 61, and is converted into thermal energy without reflection or scattering of the light. As previously described, the light absorber 61 is formed of copper, which has an excellent thermal conductivity, as a base material. The thermal energy occurring on the surface of the light absorber 61 immediately propagates thereinto, and the thermal energy reaches the rear face thereof. FIG. 5 is a diagram illustrating the configuration around the light absorber 61. In the drawing, the thermal energy within the light absorber 61 is transmitted to a heat sink 66 (i.e., heat releasing member) through a heat transfer layer 65. While the heat transfer layer 65 and the heat sink 66 are formed of a material having excellent thermal conductivity, such as copper, silver, aluminum, or the like, or of a compound containing the aforementioned material, in the same way as with the light absorber 61, both the heat transfer layer 65 and the heat sink 66 do not have a configuration subjected to processing for roughing the surface thereof, or processing for forming a TiALN film or the like thereon, for preventing propagation of heat to the wafer stage 32 due to radiation thereof.

On the other hand, although the surfaces of the light absorber 61 and the heat sink 66 facing the heat transfer layer 65 have not been subjected to particular processing for roughening, in general, the aforementioned surfaces of the light absorber 61 and the heat sink 66 formed of metal have small surface roughness of Ra of approximately 1 μm Furthermore, deformation may have occurred at the time of manufacturing, or thermal deformation of the surface shape may occur. Accordingly, the thermal transfer layer 65 is preferably formed of a soft and pasty gel material for more efficient propagation of heat, rather than employing metal such as copper, silver, aluminum, or the like, or a compound including these. Accordingly, with the exposure apparatus according to the present embodiment, a thermal-conductive gel paste or a silicone-compound paste, which is widely used as thermal filler for semiconductor apparatus, is employed as the thermal transfer layer 65. For example, the thermal-conductive gel paste is formed of a gel material having high thermal conductivity of 1 to 10 W/m·K, and accordingly, a film of the thermal-conductive gel paste (hereinafter referred as "thermal-conductive gel film") can be formed with a film thickness of 1 mm or less. However, in general, the thermal-conductive gel paste contains siloxane with a concentration of approximately several hundred ppm to several thousand ppm This results, however, in a deterioration of the transmissivity or reflectivity of the optical devices due to adhesion of siloxane particles to the surface thereof, which are emitted from the thermal conductive gel film disposed around the projection optical system 25. Accordingly, the thermal conductive gel film needs to be subjected to additional processing for preventing emission of siloxane particles. With the present embodiment, the thermal conductive gel film includes a passivation film of an aluminum film or a thin polymer film formed thereon so as to prevent emission of volatile components. While an arrangement may be made wherein the heat transfer layer 65 and the heat sink 66 have a multi-layer configuration so as to perform passive transmission of heat using thermal conduction as described above, an arrangement may be made wherein the wafer stage 32 has a configuration wherein active transmission of heat is performed using a Peltier device or the like. In particular, with an exposure apparatus employing an F2 laser or an EUV light source for emitting a laser beam in the extreme ultraviolet range as a light source, in some cases, the optical path is maintained in a vacuum of approximately $10^{-4}$ Pa or less in order to suppress decay of the exposure light in the optical path. In this case, the wafer stage 32, the light absorber 61, and the heat transfer layer 66 disposed thereon are maintained in a vacuum, and accordingly, these components need to have stability in a vacuum. However, the aforementioned thermal conductive gel film may be scattered within a vacuum chamber, leading to difficulty in employing the gel in a vacuum. Even with the above-described configuration wherein the thermal-conductive gel film is coated with an aluminum film, there exists the problem of expansion of water or bubbles contained in the thermal-conductive gel film in a vacuum, also leading to difficulty in employing the gel in a vacuum. Thus, with the exposure apparatus wherein the optical path is maintained in a vacuum, the exposure apparatus preferably has a configuration wherein a Peltier device is bonded to the light absorber 61 so as to affect active heat exchange.

With any of the above-described configurations, the exposure apparatus has a configuration such that the thermal load applied to the light absorber 61 is transmitted to the heat sink 66. However, the thermal energy accumulated on the wafer stage 32 in such a configuration is not reduced. Accordingly, with the present embodiment, a thermal insulating layer 68 is provided between the heat sink 66 and the wafer stage 32 for thermally insulating the wafer stage 32 from the heat sink 66, as well as releasing heat with the heat sink 66. The thermal insulating layer 68 is included for preventing propagation of heat from the heat sink 66 to the wafer stage 32. Note that an arrangement may be made wherein the thermal insulating layer 68 may be formed of a material having a large thermal capacity. In this case, the thermal energy is accumulated during exposure of the light absorber 61, and on the other hand, the heat accumulated in the thermal insulating layer 68 is released during off-time of exposure of the light absorber 61.

The wafer stage 32 may further include cooling tubes 67 for absorbing heat accumulated in the heat sink 66 for releasing the heat transmitted to the heat sink 66. The cooling tubes 67 have a configuration wherein a cooling medium passes through the tubes. The cooling medium is transmitted from the cooling tubes 67 within the heat sink to the outside of the wafer stage 32 through pipes (not shown), thereby releasing heat to the outside. An arrangement having a configuration for cooling the heat sink 66 according to the present invention is not restricted to the above-described arrangement, and any arrangement for cooling of the heat sink 66 that would allow practice of the present invention is applicable. In addition, an arrangement that includes cooling tubes (i.e., cooling unit) according to the present invention, is not restricted to the above-described arrangement wherein the light absorber 61 is cooled through the heat sink 66. Rather any arrangement for cooling the light absorber 61, such as an arrangement wherein the light absorber 61 is directly cooled, or an arrangement wherein the light absorber 61 is cooled through other members, that would allow practice of the present invention is applicable.

Furthermore, an arrangement may be made wherein the wafer stage 32 includes both the above-described insulating layer and the above-described cooling tubes (or cooling unit), or an arrangement may be made wherein the wafer stage 32 includes only one thereof.

As described above, in the pre-exposure process, most of the exposure light is cast onto the light absorber 61 so as to prevent accumulation of heat on the wafer stage 32 due to exposure. However, irradiation of the light absorber 61 is performed not only in the pre-exposure process or in the photo-cleaning process, but also in the test-exposure process, for example. In the test-exposure process, test exposure is repeated so as to obtain information regarding the actual change in imaging performance of the optical system 25. The exposure apparatus calculates the correction coefficients for correcting image performance of the projection optical system 25 based upon the measured results. The exposure apparatus performs correction of the change in the optical performance of the projection optical system 25 due to deformation of the optical devices or the holders of the optical devices from continuous exposure, for example, based upon the exposure amount using the aforementioned calculated correction coefficients. In the above-described test-exposure process, there is also a need to suppress the thermal load applied to the wafer stage 32 to a minimum. Accordingly, exposure light is preferably cast onto the light absorber 61, as well. Note that in some cases, the thermal load applied to the projection optical system 25 in the test-exposure process is different from that applied in the actual exposure process due to differences between the surface reflection properties of the light absorber 61 and the wafer 30 which is to be exposed in the actual exposure process. This results in an inability to obtain precise correction coefficients. According to the present invention, in order to perform the test-exposure process for obtaining the precise correction coefficients, an arrangement may be made wherein the light absorber 61 includes a region thereon having the same surface reflection properties as with the surface of the wafer 30 so as to cause the same thermal load as in the actual exposure process. An arrangement may be made wherein the wafer stage 32 includes multiple light absorbers 61 having different surface reflection properties.

The light absorber 61 according to the present invention is not restricted to an arrangement having a flat surface. Rather, an arrangement may be made wherein the light absorber 61 has a concave surface, a convex surface, or a step configuration including multiple steps.

Second Embodiment

Figure 2:
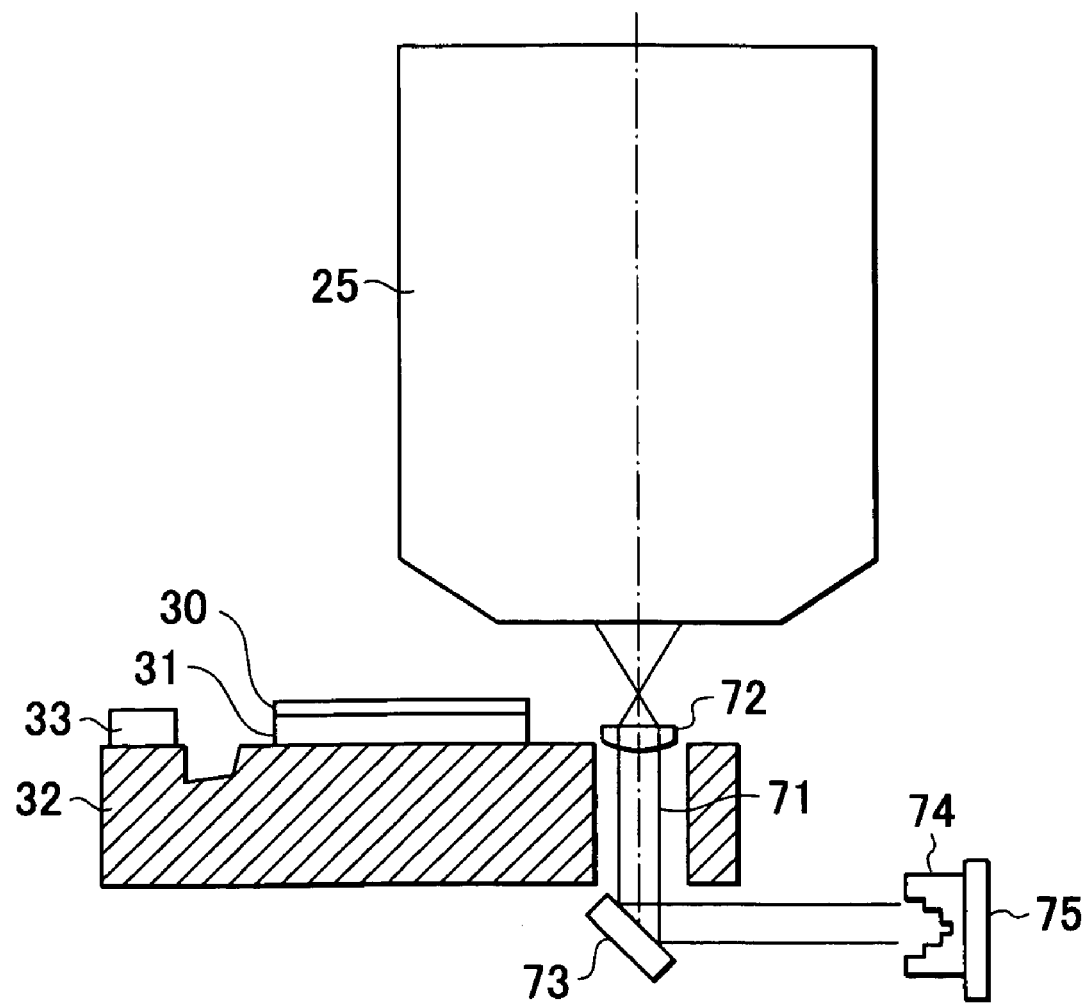
FIG. 2 is a diagram for describing a configuration example of a wafer stage according to the present invention.

FIG. 2 depicts the wafer stage 32 of an exposure apparatus according to a second embodiment of the present invention. In the drawing, the wafer stage 32 includes a through window 71. The exposure light, which has been used for the photo-cleaning or the pre-exposure, initially passes through a shaping optical system 72 for shaping the light flux, then passes through the through window 71, and is cast onto a diffuser 74 through a mirror 73.

The diffuser 74 is a recessed metal member having a rough surface as shown in FIG. 2, for example. Note that the diffuser 74 has been subjected to surface processing such that the reflectivity of the diffuser 74 for the wavelength range of the exposure light is suppressed to 1% or less. Accordingly, the exposure light, which has been used for the photo-cleaning or the pre-exposure, passes through the through window 71 without exposure of the wafer stage 32 or the wafer 30, following which the exposure light is absorbed by the diffuser 74 without scattering there around. This prevents the problem that precise correction coefficients cannot be obtained due to heat accumulated in the wafer stage 32, and the problem that the wafer 30 is exposed due to scattered light.

Figure 4:
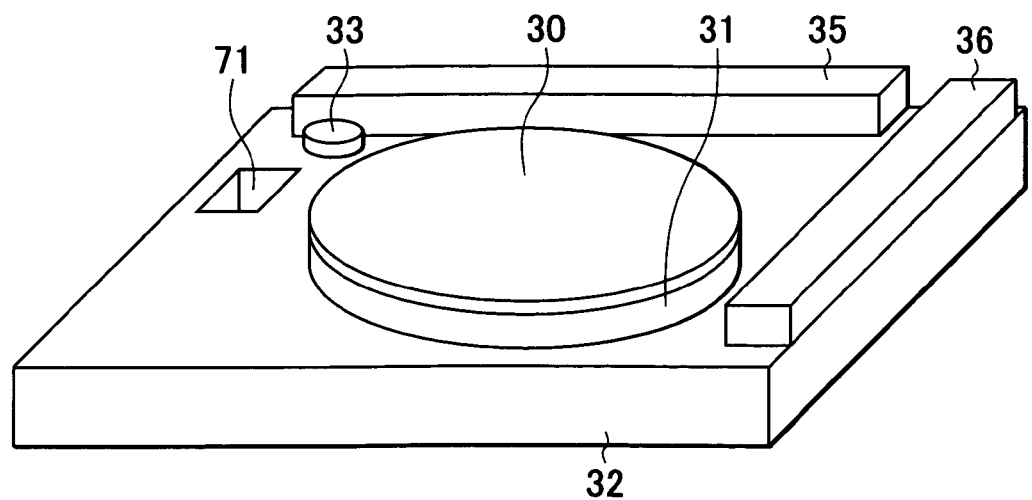
FIG. 4 is a diagram for describing a configuration of the wafer stage.

An arrangement may be made wherein the through window 71 is disposed near the illumination sensor 33 as shown in FIG. 4 for the same reason light absorber 61 as described above in embodiment 1.

In the present second embodiment, while description has been made regarding an arrangement including the through window 71, the through window 71 is not restricted to the above-described arrangement wherein the through window 71 is formed in the shape of a "hole". Rather, any arrangement, such as the wafer stage 32 including a notch on the perimeter thereof serving as the through window 71 where the exposure light passes through, that would allow practice of the present invention is applicable.

The shaping optical system 72 is formed of a material having excellent transmissivity (preferably 90% or more, more preferably 99% or more) so that the shaping optical system absorbs hardly any exposure light.

As described in the first embodiment and the second embodiment, at the time of exposure process other than the projection exposure of a wafer, such as photo-cleaning or pre-exposure, an arrangement according to the first or second embodiment prevents thermal load from being applied to the wafer 30 or the wafer stage 32 due to exposure of the projection optical system to the exposure light for the photo-cleaning or the pre-exposure, thereby enabling projection exposure with excellent precision.

Third Embodiment

Next, description will be made regarding a device manufacturing method using the exposure apparatus described in the embodiments.

Figure 12:
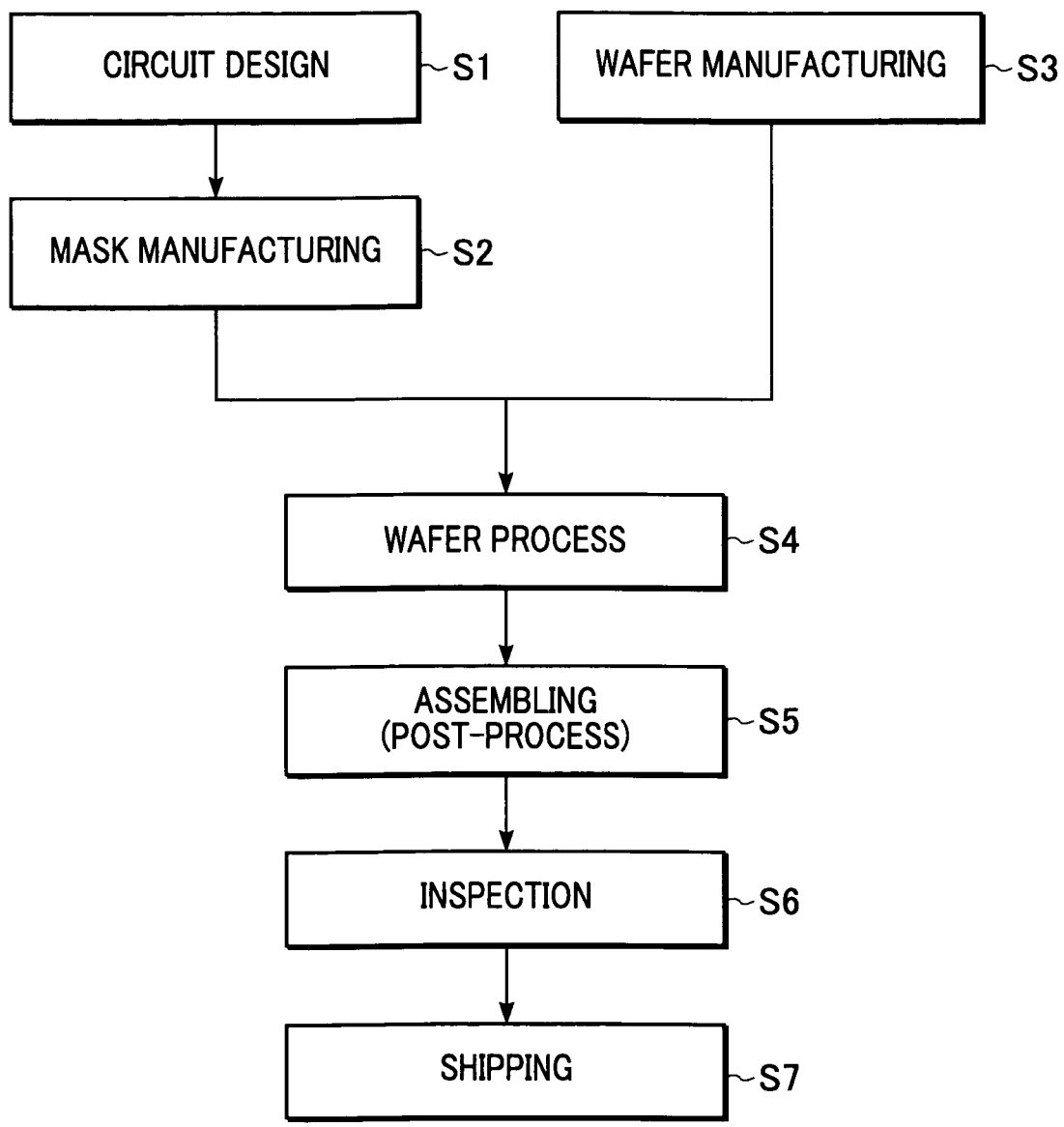
FIG. 12 is a flowchart for describing manufacturing of devices.

FIG. 12 depicts a flowchart for manufacturing devices such as semiconductor chips (e.g., ICs, LSIs, or the like), liquid crystal panels, or CCDs. In Step 1 (circuit design), the circuit of the device is designed. In Step 2 (mask manufacturing), a mask (i.e., reticle) including a designed circuit pattern thereon is manufactured, while in Step 3 (wafer manufacturing), wafers serving as substrates formed of Si or the like are manufactured. In Step 4 (wafer process), which is also referred to as "pre-process", an actual circuit is formed on the manufactured wafer by lithography using the manufactured masks. Next, in Step 5 (assembling), which is also referred to as "post-process", chip devices are manufactured by performing the post-process for the wafers manufactured in Step 4. Note that the post-processing includes several processes such as assembling process (e.g., dicing, bonding), packaging process (e.g., chip packaging), and the like. In Step 6 (inspection), the devices manufactured in Step 5 are subjected to inspection, such as testing the operation of the device, or testing the durability of the device. The devices manufactured via the above-described processes are shipped in Step 7.

Figure 13:
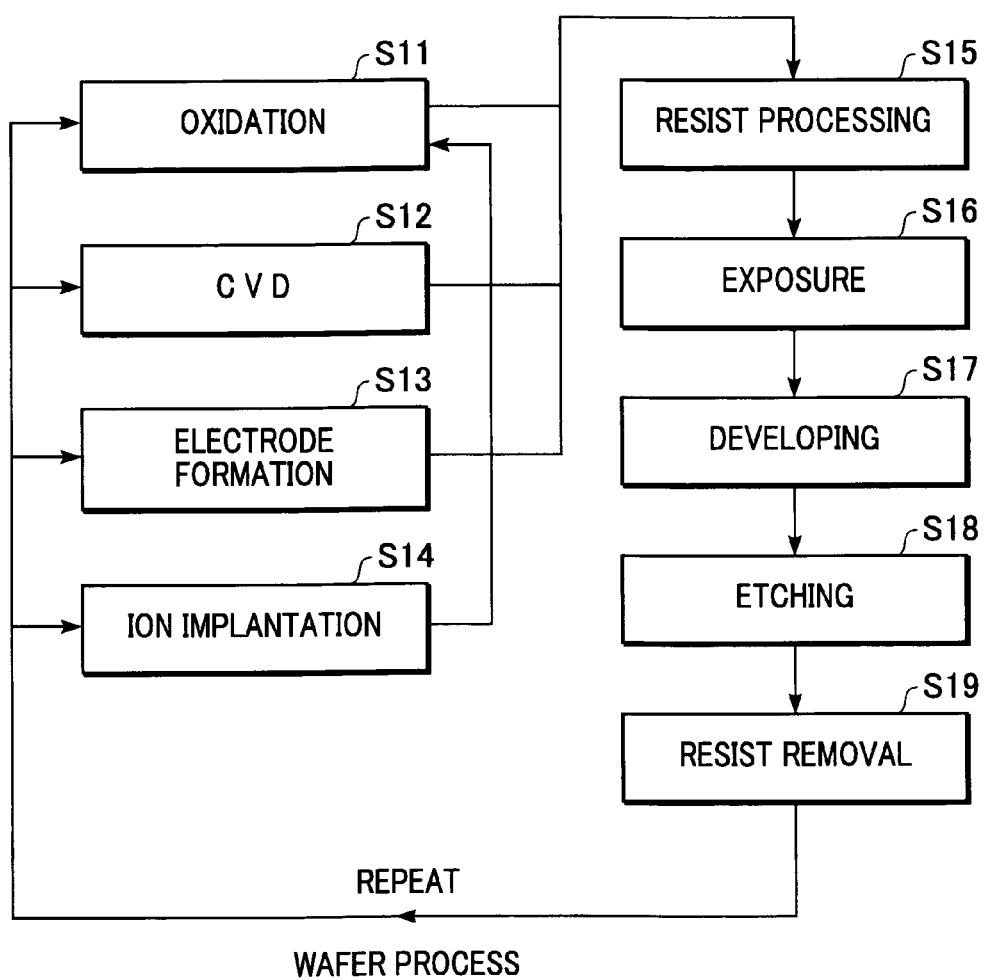
FIG. 13 is a flowchart for describing the wafer process shown in FIG. 12.

FIG. 13 is a flowchart illustrating in detail the wafer process of Step S4. In Step 11 (oxidation), the surface of the wafer is oxidized. In Step 12 (CVD), an electro-insulating film is formed on the surface of the wafer. In Step 13 (electrode formation), electrodes are formed on the wafer by vapor deposition. In Step 14 (ion implantation), ions are implanted into the wafer. In Step 15 (resist processing), the wafer is coated with a resist (e.g., photosensitive material). In Step 16 (exposure), exposure of the wafer is performed with the exposure apparatus described in the above embodiments so as to transfer the circuit pattern of the mask onto the wafer. In step 17 (developing), the exposed wafer is developed. In Step 18 (etching), etching is performed for the wafer with the resist pattern as a mask. In Step 19 (resist removal) the resist pattern, which is not required following the etching process, is removed. In the wafer process, these steps are repeated so as to form a desired circuit pattern on the wafer.

The manufacturing method according to the present embodiment enables manufacturing of high-integrated devices which are difficult to manufacture with a conventional exposure apparatus.

The entire disclosure of Japanese Patent Application No. 2003-057103 filed on Mar. 4, 2003 including claims, specification, drawings, and abstract are incorporated herein by reference in its entirety.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. An exposure apparatus comprising:
   an irradiation optical system for irradiating a pattern formed on an original plate with light emitted from a light source;

a projection optical system for projecting a light image from said pattern onto a substrate;

a drivable substrate stage for mounting said substrate; and a light absorber disposed on said substrate stage;

wherein said light absorber is disposed on said substrate stage by a thermal insulating layer.

2. An exposure apparatus according to claim 1, wherein said light absorber has a configuration so as to exhibit the reflectivity of 1% or less for the light emitted from said light source.

3. An exposure apparatus according to claim 1, further comprising a heat-releasing member disposed between the light absorber and the thermal insulating layer for releasing heat accumulated within said light absorber.

4. An exposure apparatus according to claim 3, further comprising a cooling unit disposed between the heat-releasing member and the thermal insulating layer.

5. An exposure apparatus according to claim 1, wherein said thermal insulating layer is disposed on the side of said substrate stage between said substrate stage and said light absorber, and said cooling unit is disposed on the side of said light absorber therebetween.

6. An exposure apparatus according to claim 5, further comprising a heat-releasing member disposed between said light absorber and said cooling unit for releasing heat accumulated within said light absorber.

7. An exposure apparatus according to claim 1, further comprising a secondary light source, in addition to said light source, for performing photo-cleaning for at least a part of said irradiation optical system or said projecting optical system.

8. An exposure apparatus according to claim 7, wherein said light absorber has a configuration so as to exhibit the reflectivity of 1% or less for the light emitted from said secondary light source.

9. A method for producing device fabricating method comprising the steps of:

exposing a substrate by means of using an exposure apparatus according to claim 1; and developing the exposed substrate.

* * * * *